United States Patent [19]
Habuka

[11] Patent Number: 5,672,204
[45] Date of Patent: Sep. 30, 1997

[54] APPARATUS FOR VAPOR-PHASE EPITAXIAL GROWTH

[75] Inventor: Hitoshi Habuka, Gunma-ken, Japan

[73] Assignee: Shin-Etsu Handotai Co., Ltd., Tokyo, Japan

[21] Appl. No.: 637,576

[22] Filed: Apr. 25, 1996

[30] Foreign Application Priority Data

Apr. 27, 1995  [JP]  Japan .................... 7-127122

[51] Int. Cl.$^6$ ................................ C30B 35/00
[52] U.S. Cl. ............... 117/204; 117/204; 118/715; 118/723 VE
[58] Field of Search ................... 117/200, 204; 118/715, 723 R, 723 NE, 723 MP, 723 ME, 723 E, 723 ER, 724, 725

[56] References Cited

U.S. PATENT DOCUMENTS

| | | |
|---|---|---|
| 3,293,074 | 12/1966 | Nickl . |
| 4,033,286 | 7/1977 | Shy-Shiun et al. . |
| 4,323,031 | 4/1982 | Kaplan ................ 118/723 R |
| 4,512,283 | 4/1985 | Bonifield et al. ......... 118/723 E |
| 5,531,834 | 7/1996 | Ishizuka et al. .......... 118/723 R |

FOREIGN PATENT DOCUMENTS

| | | |
|---|---|---|
| A-0 366 173 | 5/1990 | European Pat. Off. . |
| A-1 518 843 | 3/1968 | France . |
| 1295374 | 12/1986 | Japan .............. 118/723 ER |

OTHER PUBLICATIONS

Journal of Crystal Growth 107 No. 1/04 1 Jan. 1991.

*Primary Examiner*—Felisa Garrett
*Attorney, Agent, or Firm*—Ronald R. Snider

[57] ABSTRACT

An apparatus for a vapor-phase epitaxial growth of a thin film on a substrate, which attains a decrease in the transition width, and at the same time, enables the thin film to be formed in a uniform thickness. This apparatus comprises a reaction vessel 18 of a flat shape, supply nozzles 15 for feeding a source gas 19 from a peripheral part of the reaction vessel 18, a susceptor 13 for holding a semiconductor single crystal substrate(s) 12 substantially horizontally, an infrared heating lamp 14, and a gas outlet 11 provided in a central part of an upper wall of the reaction vessel 18. Owing to this apparatus, the source gas 19 is gathered in a central part of the reaction vessel 18 without forming a vortex and then is discharged through the gas outlet 11.

7 Claims, 7 Drawing Sheets

APPARATUS FOR VAPOR-PHASE EPITAXIAL GROWTH

BACKGROUND OF THE INVENTION

1. Field of the Invention

This invention relates to an apparatus for the vapor-phase growth of a thin film on a semiconductor single crystal substrate.

2. Description of the Prior Art

Heretofore, in a vertical type apparatus 1 for a vapor-phase growth shown in FIG. 9, a susceptor 3 for loading thereon a semiconductor single crystal substrate(s) 2 (hereinafter referred to briefly as "substrate(s)") is rotatably arranged horizontally in a reaction vessel 8 of the shape of a bell jar set in place on a base plate 6, and a source gas 9 supplied through a gas nozzle 5 provided in the central part of the susceptor 3 is introduced into the reaction vessel 8 while the substrate(s) 2 is heated by the use of a high-frequency induction heating coil 4 to effect growth of a thin film on the substrate(s) 2.

In the vapor-phase growth apparatus 1 mentioned above, when the gas nozzle 5 provided in the central part of the reaction vessel 8 is so constructed as to introduce the source gas 9 horizontally toward the periphery, the source gas 9 flows in a scattered manner out of the gas nozzle 5 and it is consumed in proportion as the growth of the thin film on the surface of the substrate(s) 2 advances. As a result, the concentration of the source gas 9 over the substrate(s) 2 decreases and the growth rate of the thin layer thereon decreases in accordance as the distance from the central part of the reaction vessel 8 increases. Thus, it is difficult to produce the thin film with an uniform thickness on the substrate(s) 2.

Figure 9:
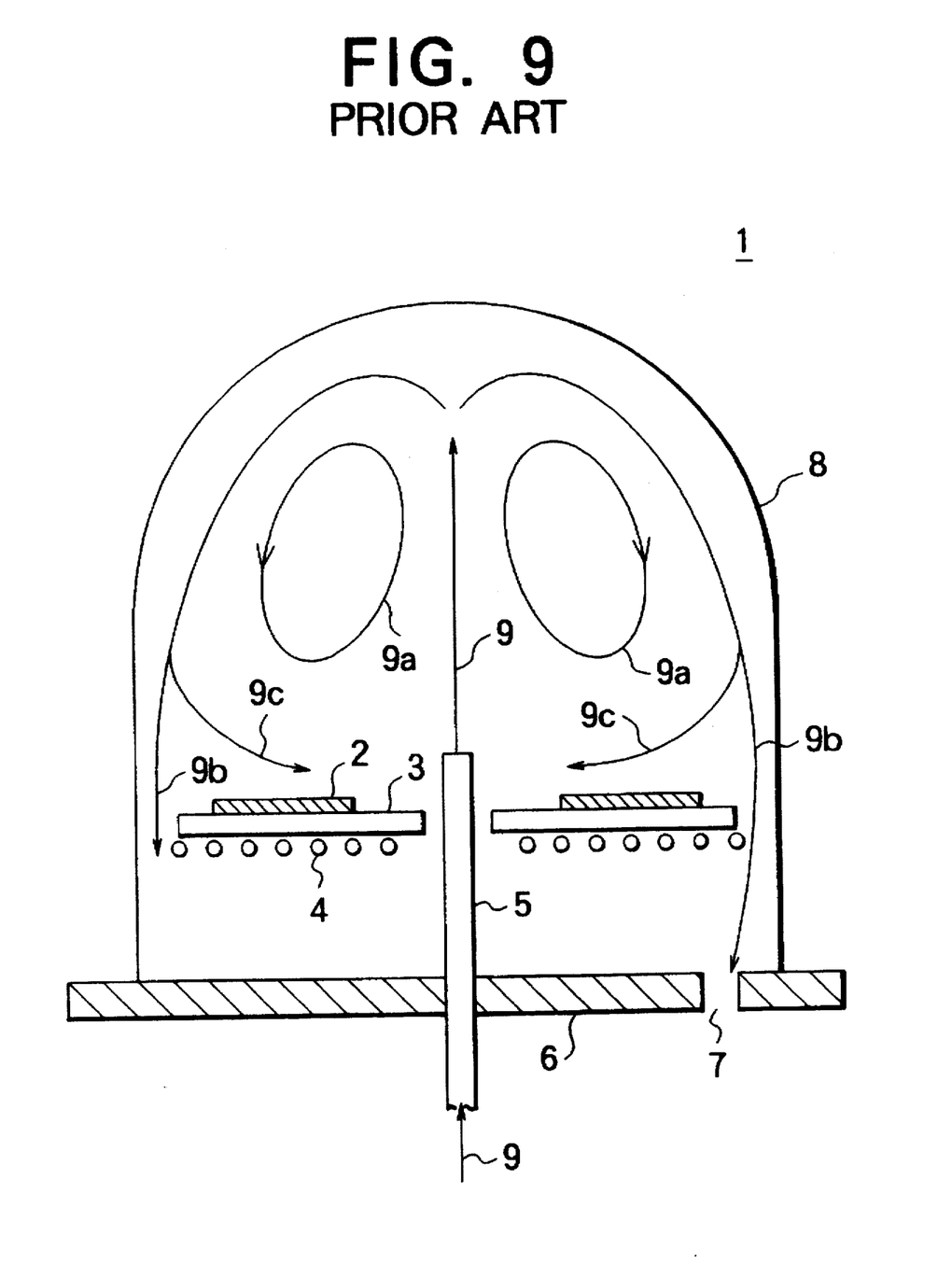
FIG. 9 is a schematic cross section showing another example of a conventional reaction vessel.

For the purpose of growing a thin film with an uniform thickness, therefore, the method which enables the source gas 9 to be introduced in the upward direction through the gas nozzle 5 by increasing the height of the reaction vessel 8 as shown in FIG. 9 has been used.

The source gas 9 introduced upwardly through the gas nozzle 5, on reaching the upper interior part of the reaction vessel 8, forms a forced convection of itself which is composed of an upward flow departing from the gas nozzle 5 and a downward flow along the inner wall of the reaction vessel 8. This forced convection and a natural convection formed by the difference of temperature between the susceptor 3 and the reaction vessel 8 are joined to produce a convection 9a.

By increasing the height of the reaction vessel 8, the reaction ambience is stirred at an increased rate by the convection 9a formed in the upper interior part of the reaction vessel 8, and the concentration of the source gas 9 can be rendered uniform by virtue of the stirring force of the convection 9a.

The source gas 9, after reaching to the upper interior part of the reaction vessel 8, goes downward along the inner wall of the reaction vessel 8 as entrained by the flow of the convection 9a and then divides into two flows, a flow 9c goes along the surface of the susceptor 3 directing and directing from the periphery of the reaction vessel 8 toward the central part thereof, and the other flow 9b goes through a space between the susceptor 3 and the inner wall of the reaction vessel 8 to be ultimately discharged through a gas outlet 7 provided in the base plate 6.

SUMMARY OF THE INVENTION

Unfortunately, when the source gas 9 is supplied in the upward direction in the reaction vessel 8 of an increased height, the gas flows slowly near the main surface of the substrate(s) 2 and the stagnant layer of gas becomes thicker. As a result, the atmosphere of the main surface of the substrate(s) 2 is affected strongly by the phenomenon of auto-doping arising from the substrate(s) itself so that the transition width, namely, the width of the part in which the concentration of impurities varies at the interface between a substrate and a thin film, tends to increase.

This invention, produced in view of the prior art mentioned above, has an object thereof the provision of an apparatus for the vapor-phase epitaxial growth of a thin film which simultaneously permits the transition width to be decreased and the thickness of the thin film to be grown uniformly.

BRIEF DESCRIPTION OF THE DRAWINGS

The invention will be better understood and objects, features, and characteristics thereof other than those set forth above will become apparent when consideration is given to the following detailed description thereof. Such description makes reference to the annexed drawings wherein.

DETAILED DESCRIPTION OF THE PREFERRED EMBODIMENTS

An apparatus of this invention is characterized by comprising a reaction vessel of a flat shape, gas supply means for feeding a source gas from the peripheral part of the reaction vessel, a susceptor for holding a semiconductor single crystal substrate(s) substantially horizontally, heating means, and a reaction gas outlet provided in the central part of an upper wall of the reaction vessel.

Appropriately, the reaction vessel is formed in the shape of a flat cylinder, and the gas supply means is provided with a plurality of gas supply inlets so adapted as to feed a source gas in the circular direction of the reaction vessel. The gas supply inlets preferably are spaced with an equal angular pitch as symmetrized around the axis of the reaction vessel. Further, the gas supply inlets are so arranged that the source gas generate a horizontal rotary flow in the reaction vessel.

Figure 1:
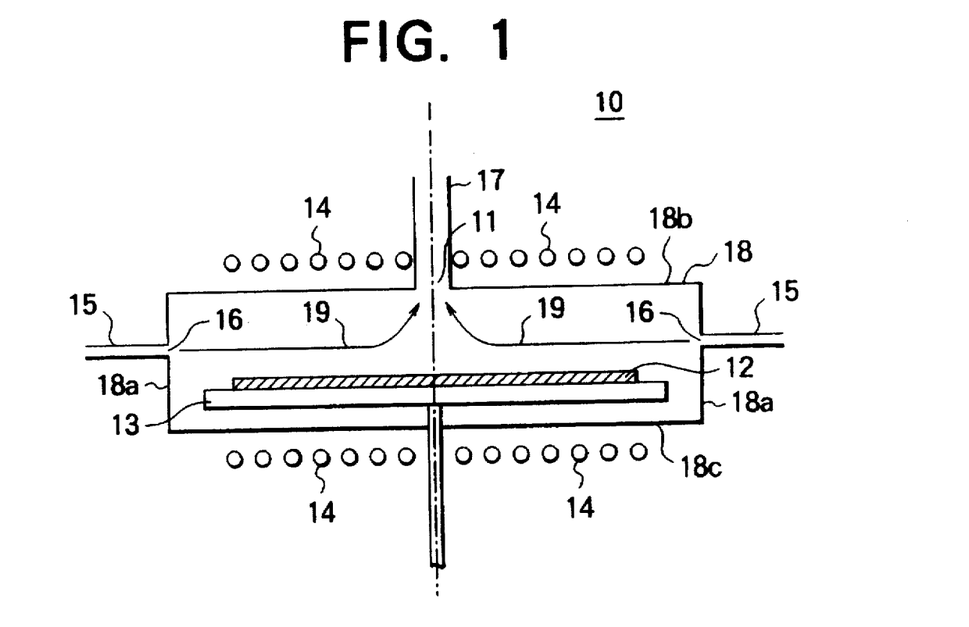
FIG. 1 is a schematic cross section showing one example of a reaction vessel according to this invention.
Figure 2:
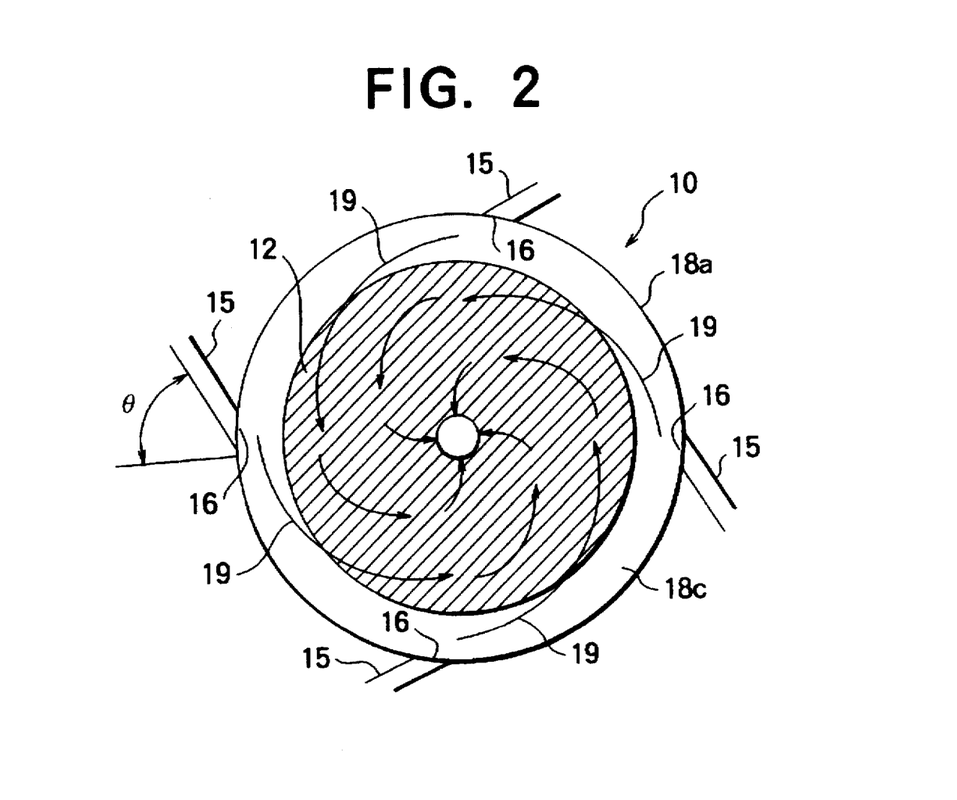
FIG. 2 is a plan view showing the flow of gas in the reaction vessel shown in FIG. 1.

For the growth of a thin film by the use of a vapor-phase growth apparatus 10 according to this invention, a substrate 12 is first set in place substantially horizontally on a susceptor (supporting member) 13 in a reaction vessel 18 as shown in FIG. 1 and FIG. 2 and then the substrate 12 is heated to a required temperature with heating means (infrared heating lamp) 14 while a carrier gas such as hydrogen is continuously fed thereto.

When a source gas 19 is subsequently introduced with the carrier gas in a horizontal direction from the peripheral part of the reaction vessel 18 of the shape of a flat cylinder, the source gas 19 flows over the substrate 12 substantially horizontally in the direction of a gas outlet 11. The source gas 19 thereafter is caused to form a slightly upward flow by the buoyant force due to heating. But, this flow of the source gas quickly goes out upward in the vertical direction through the gas outlet 11 provided in an upper wall of the reaction vessel 18 before it forms a vortex.

Since a vortex of the source gas 19 is not formed in the reaction vessel 18, the phenomenon of so-called auto-doping which is caused by the fact that the impurities hurled once from the substrate 12 into the vapor phase are transported along the vortex and incorporated with the thin film being grown can be suppressed and, as a result, the transition width at the interface between the substrate 12 and the thin film can be decreased.

When the gas outlet 11 is provided in the central part of the upper wall of the reaction vessel 18, the concentration of the source gas 19 fed from gas supply inlets 16 located at the peripheral part of the reaction vessel 18 decreases along the direction of gas flow toward the central part according to the advance of the consumption of the source for the epitaxial growth. The flow rate of the source gas 19, however, increases as the distance to the central part decreases because the source gas 19 gathers from the peripheral part of the reaction vessel to the central part.

Then, the amount of the source itself to be fed per unit time is practically uniform throughout the entire main surface of the substrate 12 and, consequently, the distribution of the epitaxial growth rate can be uniformized throughout the entire area of the substrate 12.

When the reaction vessel 18 is formed in the shape of a flat cylinder and the plurality of gas feed inlets 16 as gas feed means are so provided as to feed the source gas 19 in the circular direction of the reaction vessel 18, the source gas forms a horizontal rotary flow inside the reaction vessel, resulting the concentration of the source gas 19 can be uniformized by virtue of the stirring force generated by the horizontal rotary current mentioned above, and the gas flow can be smooth so that otherwise possible occurrence of the convection vortex of the source gas 19 can be precluded.

When the gas supply inlets 16 are so formed as to avoid protruding from the inner surface of a side wall 18a of the reaction vessel 18, the gas flow near the gas supply inlets is further smooth.

When the gas supply inlets 16 are spaced with a equal angular pitch as symmetrized around the central axis 1 of the reaction vessel 18, the distribution of thickness of the thin film deposited by the vapor-phase epitaxial growth can be further improved.

Now, this invention will be described more specifically below with reference to the working examples illustrated in the accompanying drawings.

[Example 1]

FIG. 1 is a schematic cross section of the reaction vessel 18, and FIG. 2 is a schematic plan view thereof. The reaction vessel 18 is made of transparent quartz glass, formed in the shape of a flat cylinder consisting of a cylindrical side wall 18a, a disk-shape upper wall 18b, and a disk-shape lower wall 18c, and set in place horizontally. The inner height of the reaction vessel 18, namely the distance between the inner surface of the upper wall 18b and the inner surface of the lower surface 18c, is set in the range of 10 mm to 20 mm and the inside diameter of the side wall 18a is set in the range of 250 mm to 400 mm. In the present example, a reaction vessel 18 having an inner height of 15 mm and an inside diameter of 300 mm was used.

A susceptor 13 for supporting a substrate 12 in a substantially horizontal direction is set in place in the reaction vessel 18 and a disk-shape substrate 12 having a diameter of 200 mm is held on the susceptor 13.

A set of infrared heating lamp 14 is installed outside the reaction vessel 18. With the radiant heat from the infrared heating lamp 14, the substrate 12 and the susceptor 13 in the reaction vessel 18 are heated. The outer wall of the reaction vessel 18 is cooled with such a cooling medium as air which is omitted from illustration.

On the central part of the upper wall 18b of the reaction vessel 18, a gas outlet tube 17 having an inner diameter of 20 mm is projected perpendicularly to the upper wall 18b so as to allow upward discharge of the reaction gas in the vertical direction through the gas outlet 11.

On the side wall 18a of the reaction vessel 18, four supply nozzles 15 for the source gas 19 are spaced with a equal angular pitch of 90° as symmetrized around the axis 1 of the reaction vessel 18 so as to keep the gas inlets 16 from thrusting out of the inner surface of the side wall 18a.

The four supply nozzles 15 mentioned above accord with a same specification. They are invariably set at a same angle Θ (indicated in the plan view of FIG. 2) of 75° so as to supply the source gas 19 in the circular direction of the reaction vessel 18. The supply nozzles 15 have an inside diameter of 10 mm so that the total of the opening areas occupied by the four supply nozzles 15 for introducing the gas is equal to the opening area of the gas outlet tube 17.

Trichlorosilane fed as a source gas 19 at a rate of 5 g/minute and hydrogen gas fed as a carrier gas at a rate of 100 liters/minute are mixed and the mixed gas is introduced evenly through the four supply nozzles 15 into the reaction vessel 18. The source gas 19 introduced with the carrier gas from the peripheral part of the reaction vessel 18 being fed in the circular direction of the reaction vessel 18 in the shape of a cylinder flows over the substrate 12 while generating a horizontal rotary flow, and after playing the role of effecting vapor-phase epitaxial growth on the substrate, goes out upward through the gas outlet 11.

On the substrate 12 of a single crystal silicon doped with boron having a crystal orientation of (100) and an impurity concentration of $5 \times 10^{18}$ cm$^{-3}$ in the reaction vessel 18, a thin film of silicon doped with boron having an impurity concentration of $1 \times 10^{15}$ cm$^{-3}$ was grown in a thickness of 1.5 μm by a vapor-phase epitaxial growth at a temperature of 1100° C. in one minute. The impurity concentration of the thin film was analyzed in the direction of depth. The profile of concentration thus obtained is shown in FIG. 3.

For comparison, in the conventional vapor-phase growth apparatus 1 shown in FIG. 9, on the substrate 12 of a single crystal silicon doped with boron having a crystal orientation of (100) and an impurity concentration of $5 \times 10^{18}$ cm$^{-3}$ in the reaction vessel 18, a thin film of silicon doped with boron having an impurity concentration of $1 \times 10^{15}$ cm$^{-3}$ was grown in a thickness of 1.5 μm by a vapor-phase epitaxial growth at a temperature of 1100° C. in one minute, in the same manner as in the preceding example. The impurity concentration of the thin film was analyzed in the direction of depth. The profile of concentration thus obtained is additionally shown in FIG. 3.

Figure 3:
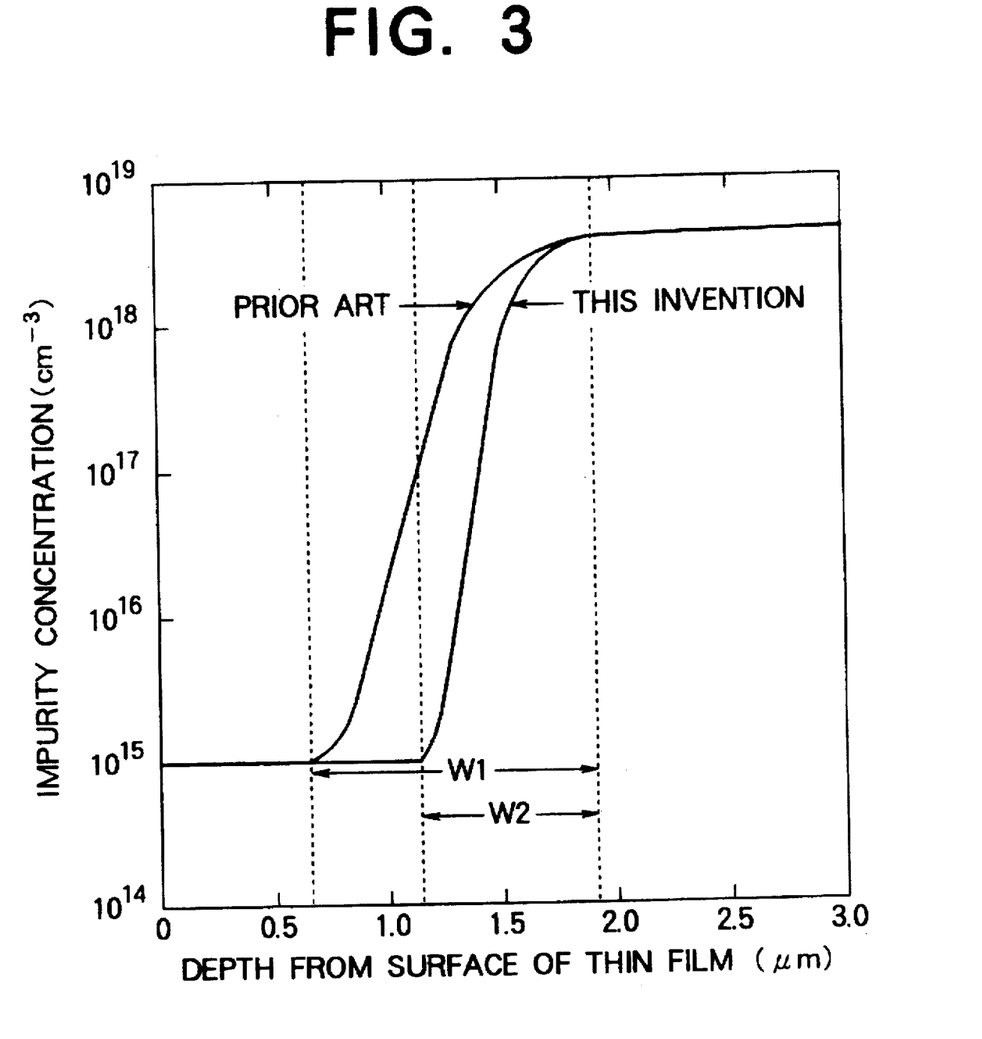
FIG. 3 is profiles of impurity concentrations determined in the direction of film depth.
Figure 4:
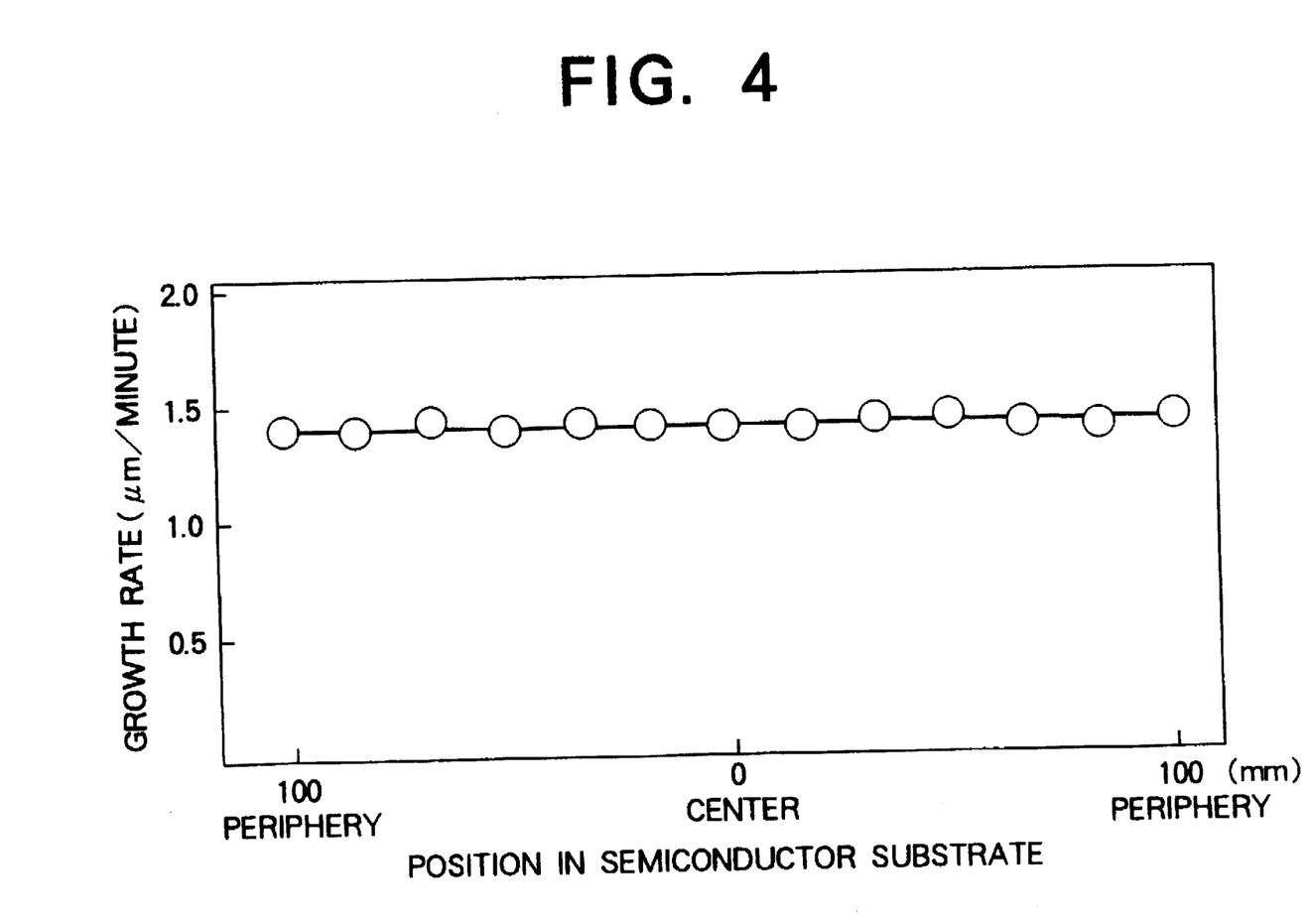
FIG. 4 is a graph showing the growth rate distribution in the direction of diameter of a substrate, obtained by a thin film growth in the reaction vessel according to this invention.

It is noted from FIG. 3 that the transition width W2 obtained by the epitaxial growth in the reaction vessel 18 of the vapor-phase growth apparatus 10 according to this invention is 0.8 μm, whereas the transition width W1 obtained by the epitaxial growth in the conventional vapor-phase growth apparatus 1 is 1.3 μm. This fact indicates that this invention accomplishes a notable improvement of the transition witdth FIG. 4 shows the growth rate profile direction of diameter of the substrate 12 in the reaction vessel 18 according to this invention, obtained by thin film growth on the substrate 12. The growth rate is obtained by dividing the thickness at each point by the growth time. As clearly noted from this diagram, the use of the vapor-phase growth apparatus of this invention attains a notable improvement in the transition width, and at the same time, enables a thin film to be formed in a uniform thickness and a uniform growth rate distribution throughout the entire main surface of the substrate 12.

In Example 1 cited above, since the gas outlet tube 17 is positioned above the substrate 12, a possibility is suspected that particles arising from a side reaction of the vapor-phase epitaxial growth adhere to the gas outlet tube 17, fall therefrom onto the substrate 12, and give rise to a defect of the surface of the formed thin film. In actuality, however, the surface of the thin film is not found to have any surface defects such as a protruding defect.

For the purpose of curbing the occurrence of particles by a side reaction as mentioned above, it suffices to adjust such as the average retention time of the source gas 19 in the reaction vessel 18 by appropriately setting the flow volume of the mixed gas of the source gas 19 and the carrier gas from the supply nozzle 15, the inside diameter of the gas outlet tube 17, the inner volume of the reaction vessel 18, etc.

Figure 5:
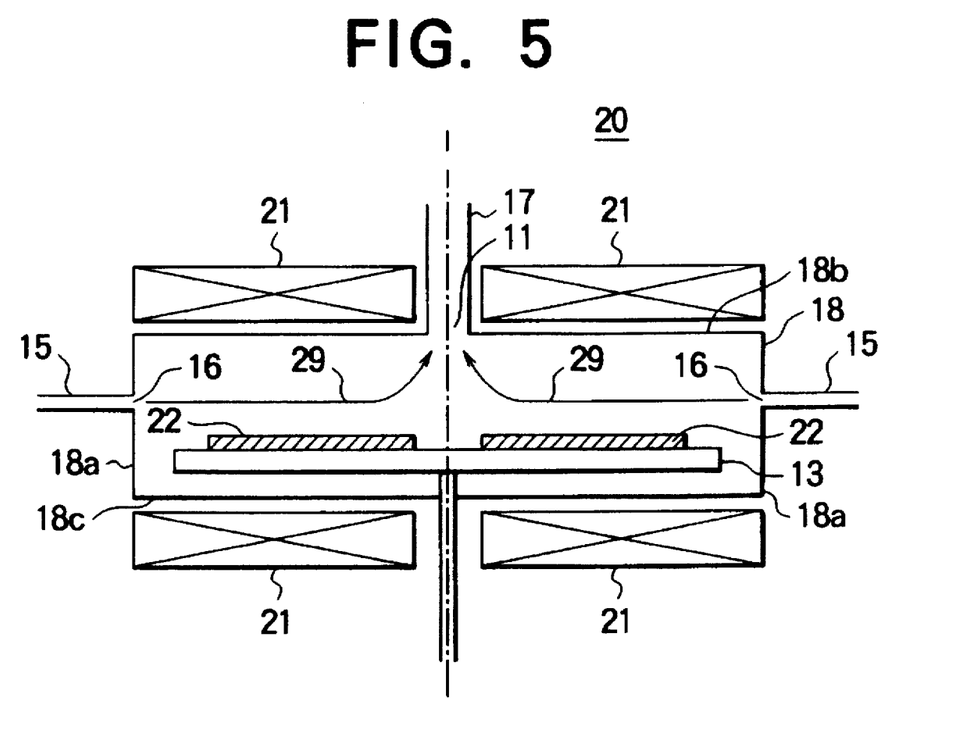
FIG. 5 is a schematic cross section showing another example of a reaction vessel according to this invention.

Example 1 cited above has been depicted as a case of loading one substrate 12 having a diameter of 200 mm in the reaction vessel 18. It is naturally permissible to have a plurality of substrate(s) of a smaller diameter simultaneously loaded in the reaction vessel 18 for the vapor-phase epitaxial growth. FIG. 5 portrays a plurality of substrate(s) 22 loaded for vapor-phase epitaxial growth. In this diagram, 20 stands for a vapor-phase growth apparatus, 21 for a resistance heating furnace, and 29 for a source gas. In the diagram, like parts found in FIG. 1 are denoted by like reference numerals.

This method of growth is particularly effective when thin films such as GaAs, GaP, and GaAsP are grown on such substrate(s) 22 made of GaAs, GaP, and GaAsP, because those substrate(s) 22 have smaller diameters than the substrate(s) made of silicon.

Now, the case of growing a GaAsP thin film for an orange color light-emitting diode on a substrate made of GaP will be described below with reference to FIG. 5 through FIG. 8.

[Example 2]

The reaction vessel 18 of FIG. 5 is identical in shape and construction with the reaction vessel 18 of FIG. 1. However it is different from the latter reaction vessel in respect that the resistance heating furnace 21 is so prepared as to encircle the upper wall 18b and the lower wall 18c of the reaction vessel 18. The reaction vessel 18 has an inside diameter of 250 mm and an inner height of 20 mm. The preparation of the resistance heating furnace 21 in the manner described above is for the purpose of suppressing the deposition on the wall of the reaction vessel 18 by heating the walls.

First, in the reaction vessel 18 of FIG. 5, six substrate(s) made of GaP of 50 mm in diameter are set in place concentrically with the side wall 18a of the reaction vessel 18. A mixed gas consisting of gallium chloride (GaCl), arsine ($AsH_3$) and phosphine ($PH_3$) as the source gas 29, ammonia ($NH_3$) and hydrogen sulfide ($H_2S$) as the dopant and hydrogen gas as a carrier gas were supplied at a flow rate of 14 liters/minute. This mixed gas contains GaCl at a rate of 110 ml/minute, $AsH_3$ at a rate of 26 ml/minute, $PH_3$ at a rate of 48 ml/minute, $NH_3$ at a rate of 600 ml/minute, and a very minute amount (several ml/minute) of $H_2S$.

By the use of this source gas 29, an n-type GaAsP layer having a film thickness of about 40 μm was formed at a growth rate of 0.2 μm/minute. About 60% of the film thickness of 40 μm serves as a composition grading layer for allowing gradual change of the crystal composition from GaP of the substrate to GaAsP.

Figure 8:
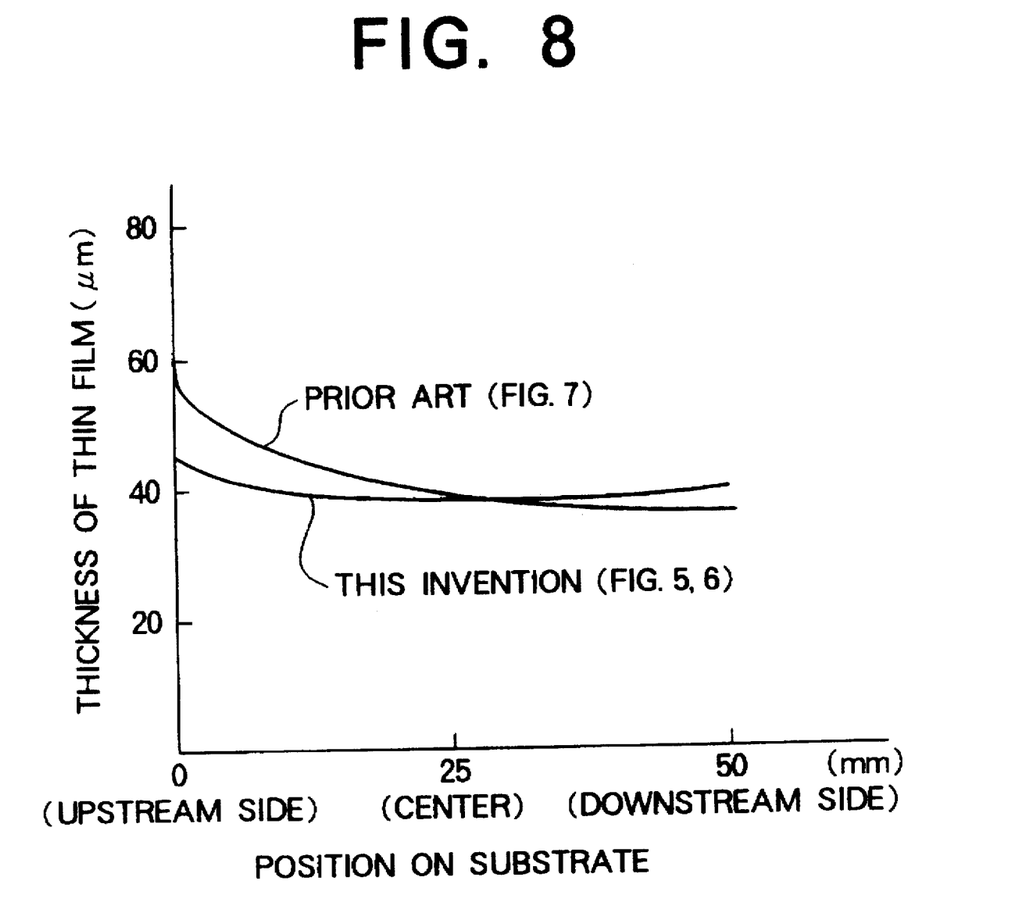
FIG. 8 is a graph comparing the distribution of thickness of a thin film formed by the reaction vessel shown in FIG. 5 with the distribution of thickness of a thin film formed by the reaction vessel shown in FIG. 7.

The thickness of the thin film obtained by the epitaxial growth mentioned above was measured from the upstream side to the downstream side of the flow of the source gas. The results are shown in FIG. 8. In the graph of FIG. 8, the horizontal axis is a scale of the position of measurement of film thickness on the substrate, and the vertical axis is a scale of the thickness of thin film obtained by the measurement. In the graph, the point "0 mm (upstream side)" on the horizontal axis represents the peripheral part A of the substrate nearest to the side wall 18a of the reaction vessel 18, the point "25 mm (central part)" represents the central part B of the substrate, and the point "50 mm (downstream side)" represents the peripheral terminal part C of the substrate nearest to the central part of the reaction vessel 18.

Figure 7:
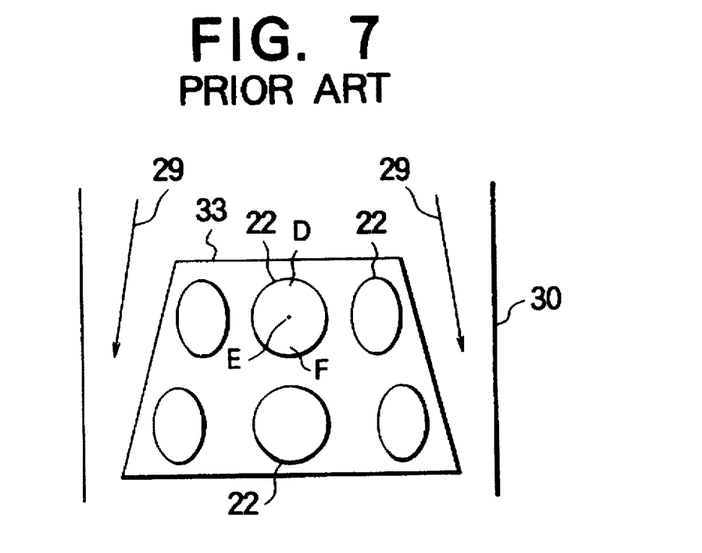
FIG. 7 is a schematic front view showing an essential part of one example of a conventional reaction vessel.

In a comparative example, a susceptor 33 was set in place in a reaction vessel 30 designed for the conventional growth of a thin film of compound semiconductor single crystal shown in FIG. 7, and six substrate(s) 22 were loaded each in the upper and the lower zone of the susceptor 33, and the source gas 29 was supplied in a downstream direction to effect vapor-phase epitaxial growth. The components, composition, and flow volume per substrate of the source gas 29 were set equal to those of Example 2 mentioned above.

The thickness of the thin film obtained by the vapor-phase epitaxial growth in the conventional reaction vessel 30 mentioned above was measured from the upstream side to the downward side of the flow of the source gas. The results are additionally shown in FIG. 8. In the graph, the point "0 mm (upstream side)" represents the upper peripheral part D of the substrate, the point "25 mm (central part)" represents the central part E of the substrate, and the point "50 mm (downstream side)" represents the lower terminal part F of the substrate.

Figure 6:
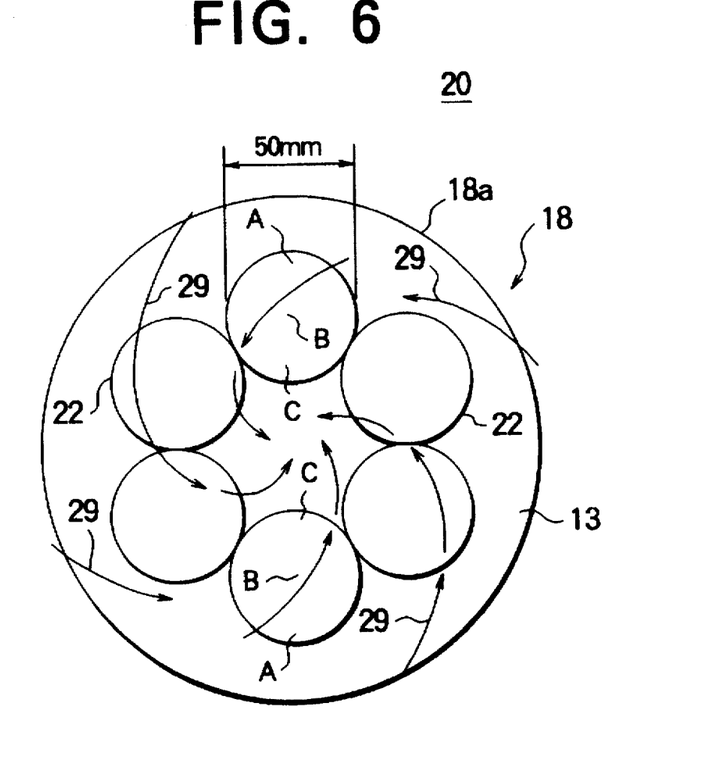
FIG. 6 is a plan view showing the arrangement of the substrate and the flow of gas in the reaction vessel shown in FIG. 5.

It is clearly noted from FIG. 8 that in the conventional apparatus shown in FIG. 7 in which the source gas 29 is consumed as it flows from the upstream to the downstream side, since the shortage of gas supply due to this consumption cannot be compensated by the adjustment of the flow volume, the thickness of the thin film gradually decreases from the upstream to the downstream side, specifically from the thickness of about 60 μm at the point D on the upstream side to the thickness of about 37 μm at the point F on the downstream side. Thus, the thickness of epitaxial growth shows a large gradient. When the apparatus of Example 2 according to this invention shown in FIG. 5 and FIG. 6 is used, the maximum thickness of the thin film is about 45 µm and the minimum thickness thereof about 38 µm, indicating that the distribution of thickness of the thin film is appreciably uniform throughout the entire area of the substrate.

It is clear from the description given above that in the vapor-phase epitaxial growth apparatus according to this invention, the phenomenon of so-called auto-doping which is caused by the fact that the impurities hurled once from the substrate into the vapor phase are carried with the vortex and taken into the thin film being grown can be suppressed and, as a result, the transition width of the interface between the substrate and the thin film can be decreased because the source gas is quickly discharged upwardly in the vertical direction through the outlet provided in the upper wall of the reaction vessel before it forms a vortex, and as a result, the generation of a vortex of the source gas cannot occur.

Further, in the vapor-phase epitaxial growth apparatus according to this invention, the distribution of the epitaxial growth rate and the distribution of the film thickness can be uniform throughout the entire area of the substrate because the amount of the source supplied per unit time can be rendered practically uniform throughout the entire main surface of the substrate. As a result, this invention attains a decrease in the transition width, and at the same time, enables the thin film to be formed in a uniform thickness on the substrate.

What is claimed is:

1. An apparatus for a vapor-phase epitaxial growth of a thin film comprising:

a reaction vessel of a flat shape;

gas supply means for feeding a source gas from a peripheral part of said reaction vessel;

a susceptor for holding a semiconductor single crystal substrate(s) substantially horizontally;

heating means;

a reaction gas outlet means provided in a central part of an upper wall of said reaction vessel;

wherein said reaction vessel is formed in the shape of a flat cylinder; and said gas supply means comprises a plurality of gas supply inlets adapted to feed the source gas in a circular direction of said reaction vessel.

2. The vapor-phase epitaxial growth apparatus according to claim 1, wherein said gas supply inlets are spaced with a equal angular pitch as symmetrized around an axis of said reaction vessel.

3. The vapor-phase epitaxial growth apparatus according to claim 1, wherein said gas supply inlets are so arranged in said reaction vessel as to produce a horizontal rotary flow of the source gas.

4. An apparatus for a vapor-phase epitaxial growth of a thin film comprising:

a reaction vessel of a flat shape;

gas supply means for feeding a source gas from a peripheral part of said reaction vessel;

a susceptor for holding a semiconductor single crystal substrate(s) substantially horizontally;

heating means;

a reaction gas outlet means provided in a central part of an upper wall of said reaction vessel for making the source gas go out upward through the gas outlet before the source gas forms a vortex.

5. An apparatus for a vapor-phase epitaxial growth of a thin film in accordance with claim 4 comprising:

a reaction vessel of a flat shape;

gas supply means for feeding a source gas from a peripheral part of said reaction vessel;

a susceptor for holding a semiconductor single crystal substrate(s) substantially horizontally;

heating means;

a reaction gas outlet means provided in a central part of an upper wall of said reaction vessel;

wherein said reaction vessel is formed in the shape of a flat cylinder; and said gas supply means comprises a plurality of gas supply inlets adapted to feed the source gas in a circular direction of said reaction vessel.

6. The vapor-phase epitaxial growth apparatus according to claim 5 wherein said gas supply inlets are spaced with a equal angular pitch as symmetrized around an axis of said reaction vessel.

7. The vapor-phase epitaxial growth apparatus according to claim 5 wherein said gas supply inlets are so arranged in said reaction vessel as to produce a horizontal rotary flow of the source gas.

* * * * *